United States Patent
Bilinski et al.

(10) Patent No.: US 11,594,367 B2
(45) Date of Patent: Feb. 28, 2023

(54) CHOKE AND TEST ASSEMBLY FOR CARRYING OUT HIGH-VOLTAGE TESTING

(71) Applicant: Maschinenfabrik Reinhausen GmbH, Regensburg (DE)

(72) Inventors: Enrico Bilinski, Dresden (DE); Ullrich Clemens, Dresden (DE); Guenther Siebert, Dresden (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 217 days.

(21) Appl. No.: 16/771,226

(22) PCT Filed: Nov. 21, 2018

(86) PCT No.: PCT/EP2018/082110
§ 371 (c)(1),
(2) Date: Jun. 10, 2020

(87) PCT Pub. No.: WO2019/115191
PCT Pub. Date: Jun. 20, 2019

(65) Prior Publication Data
US 2021/0096154 A1    Apr. 1, 2021

(30) Foreign Application Priority Data

Dec. 15, 2017   (DE) .................... 10 2017 130 182.8

(51) Int. Cl.
*G01R 1/02*    (2006.01)
*H01F 27/28*   (2006.01)
(Continued)

(52) U.S. Cl.
CPC ............. *H01F 27/363* (2020.08); *G01R 1/02* (2013.01); *H01F 17/02* (2013.01); *H01F 27/02* (2013.01); *H01F 27/28* (2013.01); *H01F 27/366* (2020.08)

(58) Field of Classification Search
CPC  G01R 1/02; G01R 31/14; H01F 27/02; H01F 27/366; H01F 17/02; H01F 27/36; H01F 27/363; H01F 37/005; H01F 27/28
See application file for complete search history.

(56) References Cited

U.S. PATENT DOCUMENTS 1,811,466 A  *  6/1931  George ................. H01F 37/005
                                                    336/84 R
3,225,319 A     12/1965  Barclay
(Continued)

FOREIGN PATENT DOCUMENTS

DE          1287203 B        1/1969
DE      19542529 C1  *      6/1997  ............. G01R 31/14
(Continued)

OTHER PUBLICATIONS

Vos Hans-Juergen et al DE 19542529 C1, Jun. 12, 1997, English Translation.*

*Primary Examiner* — Jermele M Hollington
*Assistant Examiner* — Suresh K Rajaputra
(74) *Attorney, Agent, or Firm* — Leydig, Voit & Mayer, Ltd.

(57) ABSTRACT

A choke is used to carry out high-voltage tests. The choke includes: a housing; a coil arranged in an interior of the housing; at least one electrically conductive component arranged between the coil and the housing; and a flux guide configured to guide a magnetic flux that is configured to be generated by the coil. The flux guide includes a ferromagnetic material; and is arranged between the coil and the at least one electrically conductive component in such a way (Continued)

that the magnetic flux that is configured to be generated by the coil is guided past the electrically conductive component.

15 Claims, 1 Drawing Sheet

(51) Int. Cl.
*H01F 27/02* (2006.01)
*H01F 17/02* (2006.01)
*H01F 27/36* (2006.01)

(56) References Cited

U.S. PATENT DOCUMENTS 4,338,561 A * 7/1982 Zaengl .................. G01R 31/14
323/208
2017/0299554 A1 10/2017 Bondurant et al.

FOREIGN PATENT DOCUMENTS

| DE | 102008011802 A1 | | 9/2009 | |
|----|----|----|----|----|
| EP | 0012721 A1 | | 6/1980 | |
| GB | 1005120 A | * | 9/1965 | ............. H01F 30/08 |
| GB | 1005120 A | | 9/1965 | |

* cited by examiner

CHOKE AND TEST ASSEMBLY FOR CARRYING OUT HIGH-VOLTAGE TESTING

CROSS-REFERENCE TO PRIOR APPLICATIONS

This application is a U.S. National Phase Application under 35 U.S.C. § 371 of International Application No. PCT/EP2018/082110, filed on Nov. 21, 2018, and claims benefit to German Patent Application No. DE 10 2017 130 182.8, filed on Dec. 15, 2017. The International Application was published in German on Jun. 20, 2019 as WO 2019/115191 under PCT Article 21(2).

BACKGROUND

The invention relates to a choke for carrying out high-voltage tests on a test piece and to a test arrangement with at least one such choke.

BACKGROUND

High-voltage installations and high-voltage components represent capacitive test objects. For the purpose of high-voltage testing, these capacitive test objects are connected with one or more chokes to form a resonance circuit, which is supplied with power by a feed with, for example, variable frequency. In that case, use is made of, for example, chokes with air-cored coils arranged in a metal vessel. In such chokes there is an uncontrolled distribution of the magnetic flux, which leads to increased eddy current loses not only in the metal vessel, but also in electrically conductive components of the choke in the interior of the metal vessel. The quality of the resonance circuit is reduced by these eddy current losses.

SUMMARY

An embodiment of the present invention provides a choke that is used to carry out high-voltage tests. The choke includes: a housing; a coil arranged in an interior of the housing; at least one electrically conductive component arranged between the coil and the housing; and a flux guide configured to guide a magnetic flux that is configured to be generated by the coil. The flux guide includes a ferromagnetic material; and is arranged between the coil and the at least one electrically conductive component in such a way that the magnetic flux that is configured to be generated by the coil is guided past the electrically conductive component.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
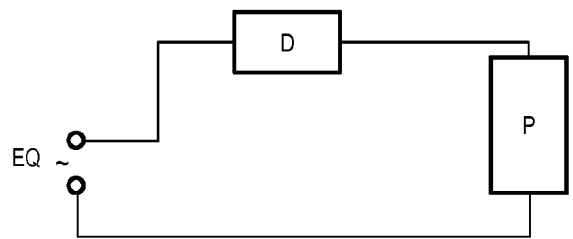
FIG. 1 shows a block circuit diagram of an exemplifying form of embodiment of a test arrangement with a choke according to the improved concept.

Embodiments of the present invention provide an improved concept for chokes for carrying out high-voltage tests, by which eddy current losses are reduced.

The improved concept is based, at least in part, on the idea of providing, in the interior of the choke, ferromagnetic material as a flux guiding device, by which the magnetic flux is guided past electrically conductive components, which otherwise can be a source for increased eddy current losses.

According to the improved concept, there is indicated a choke for carrying out high-voltage tests, which comprises a housing, a coil arranged in the interior of the housing, at least one electrically conductive component and a flux guiding device for guiding a magnetic flux able to be generated by means of the coil. The electrically conductive component is arranged between the coil and the housing. The flux guiding device comprises a ferromagnetic material and is so arranged between the coil and the at least one electrically conductive component that the magnetic flux able to be generated by means of the coil is guided past or substantially guided past the electrically conductive component.

In that case, guidance or substantial guidance of a magnetic flux past the electrically conductive component is to be understood in the sense that the magnetic flux is eliminated or reduced by the electrically conductive component. This is achieved by the fact that, in particular, the flux guiding device is arranged between the coil and the electrically conductive component. As a result, eddy currents and corresponding eddy current losses in the electrically conductive component are prevented or reduced. If the choke is used in a test arrangement as a component of a resonance circuit this ultimately leads to an improved quality of the resonance circuit. As a result, the power to be made available to the test arrangement can be reduced. At the same time, through use of the ferromagnetic material the inductance of the choke is increased so that the constructional size of the choke can be reduced for the same inductance or the effectiveness of the choke is increased for the same constructional size.

According to at least one form of embodiment, the ferromagnetic material of the flux guiding device or of individual components of the flux guiding device comprises an electrical sheet or a stack of electrical sheets or an electrical sheet material or an amorphous ferromagnetic material.

According to at least one form of embodiment, the housing consists at least in part of electrically conductive material, for example metal. The flux guiding device is arranged in such a way that it shields the electrically conductive material of the housing from a magnetic flux able to be generated by means of the coil.

According to at least one form of embodiment, the housing consists at least in part of steel. For example, a housing wall of the housing can consist entirely of steel.

Through shielding of the housing from the flux, eddy current losses in the housing are reduced. This makes it possible to dispense with cost-intensive materials with particularly high electrical conductivity such as, for example, aluminium and instead to use economic materials such as steel. In addition, the wall strength of the housing material can be reduced without thermal effects, which are caused by eddy current losses, exceeding a technically acceptable level as a consequence.

According to at least one form of embodiment, the flux guiding device comprises a cylindrical, particularly circularly cylindrical, component, which radially surrounds the coil at least partly. Radially surrounds in that case means in a plane perpendicular to the winding axis of the coil. In axial direction, thus a direction parallel to the winding axis, the coil can project beyond the cylindrical component or can be coterminous with the cylindrical component. Alternatively, the cylindrical component can project axially beyond the coil.

According to at least one form of embodiment, the cylindrical component completely radially surrounds the coil.

According to at least one form of embodiment, the cylindrical component consists at least in part of a ferromagnetic material.

According to at least one form of embodiment, the flux guiding device comprises at least two segments, which are arranged in radial distribution, for example equidistantly distributed, around the coil and which extend axially, for example entirely or substantially entirely, along the coil. Number and dimensions of the segments can in that case be such that the segments together completely or partly radially surround the coil.

According to at least one form of embodiment, the segments are constructed to be rod-shaped or block-shaped or as sections of a hollow cylinder, particularly a hollow circular cylinder.

According to at least one form of embodiment, the segments each consist at least in part of a ferromagnetic material.

According to at least one form of embodiment, the flux guiding device is electrically and mechanically connected with the coil. As a result, the flux guiding device and the coil lie at the same electrical potential.

According to at least one form of embodiment, the housing is electrically isolated from the flux guiding device and from the coil.

According to at least one form of embodiment, the flux guiding device or the cylindrical component or the segments is or are carried by the coil and/or lies or lie on the coil. A particularly compact mode of construction of the choke is thereby achieved.

According to at least one form of embodiment, the flux guiding device or the cylindrical component or the segments is or are connected with the coil by means of adjusting screws. In particular, a gap can thereby be achieved between the flux guiding device or cylindrical component or segments and coil so as to provide compensation for tolerances due to production.

According to at least one form of embodiment, the at least one electrical component comprises at least one field control electrode.

During a high-voltage test, the housing and flux guiding device lie at different electrical potentials. The field control electrode accordingly represents a screening body serving the purpose of preventing occurrence of ultra-high field strengths at corners, edges or surfaces with low radius of curvature, and thus, reducing necessary spark distances in the interior of the choke, particularly necessary spacings between the coil and housing or the flux guiding device and housing.

According to at least one form of embodiment, the electrically conductive component or the field control electrode is arranged between the flux guiding device and the housing, particularly radially between the flux guiding device and the housing.

According to at least one form of embodiment, the field control electrode is arranged at a face end of the cylindrical component or the segments.

According to at least one form of embodiment, the at least one electrical component comprises one or more further field control electrodes.

According to at least one form of embodiment, one of the further field control electrodes is arranged at a further face end of the cylindrical component or the segments.

According to at least one form of embodiment, the field control electrode comprises an annular structure and is oriented coaxially with respect to the winding axis of the coil.

According to at least one form of embodiment, the field control electrode consists partly or completely of metal. In particular, the field control electrode comprises a metal body. In particular, the field control electrode is not made of an electrically insulating body with an electrically conductive coating.

Through the guidance of the magnetic flux past the field control electrode by means of the flux guiding device and the thereby-reduced eddy currents in the field control electrode the construction with a metal body can be used. By comparison with the use of plastics material bodies with a conductive coating, for example a coating of semiconductor material, this has on the one hand a cost advantage. Moreover, the field control electrode with a metal body can have a surface with a lower level of roughness, for example a polished surface, and thus lead to lower maximum field strengths. The required spark distances in the interior of the choke are thereby reduced and thus a more compact form of construction is made possible.

According to at least one form of embodiment, the choke comprises a suspension, particularly a central suspension, which carries the coil.

According to at least one form of embodiment, the suspension consists of electrically non-conductive material.

According to at least one form of embodiment, the suspension is oriented coaxially with respect to the winding axis of the coil.

According to at least one form of embodiment, the suspension comprises one or more supports mechanically connected together.

According to at least one form of embodiment, the flux guiding device comprises an inner component arranged in the interior of the suspension. In particular, the inner component consists at least in part of ferromagnetic material. The inductance of the choke is thereby further increased.

According to at least one form of embodiment, the flux guiding device comprises at least one end component which is arranged at a face end of the coil and oriented perpendicularly to the winding axis of the coil. In particular, the end component consists at least in part of ferromagnetic material. As a result, parts of the housing lying at the end of the coil or correspondingly arranged electrically conductive components of the choke are shielded from the magnetic flux.

According to at least one form of embodiment, the end component is connected with the cylindrical component or with at least one of the segments.

According to at least one form of embodiment, the choke comprises at least one further coil, which is connected with the coil in series.

According to at least one form of embodiment, the coil and the at least one further coil have the same winding axis and are arranged axially adjacent to one another or radially one above the other, particularly on the suspension.

According to at least one form of embodiment, the coil is constructed as an air coil, thus as a coil without a ferromagnetic core. If the choke comprises a further coil axially adjacent to the coil, then this is also constructed as an air coil. The term air coil in that case does not exclude the presence, instead of or apart from air, of other non-ferromagnetic materials, particularly insulating media, in the housing and in the interior of the coil.

The coil and the further coils can, for example, be wound in such a way that axially adjacent coils have respectively different potentials, particularly high-voltage potentials, at their radially inner side. These coils therefore have appropriate axial spacings from one another so as to ensure the requisite electrical dielectric strength. It is ensured by the construction as air coils that the spacings are not bridged over.

According to at least one form of embodiment, the choke comprises a high-voltage terminal for electrical contacting of the coil, particularly a first contact of the coil. The high-voltage terminal can in that case serve for, for example, connection of the test piece.

According to at least one form of embodiment, the high-voltage terminal comprises a high-voltage lead-through.

According to at least one form of embodiment, the choke comprises a further voltage terminal, particularly a further high-voltage terminal, which comprises a lead-through, particularly a further high-voltage lead-through.

In at least one embodiment, in which the choke has only one coil, the further voltage terminal serves for electrical connection of a second contact of the coil.

In at least one form of embodiment, in which the choke comprises the coil and a further coil, the further voltage terminal serves for electrical connection of the further coil.

According to at least one form of embodiment, the suspension is secured to the high-voltage lead-through and/or the further lead-through.

According to at least one form of embodiment, the high-voltage lead-through and the further lead-through are arranged at opposite sides of the housing.

According to at least one form of embodiment, the choke is constructed as a choke with fixed, in particular non-variable, inductance.

According to at least one form of embodiment, the interior space of the housing is filled with an insulating medium, particularly a non-conductive fluid, for example an insulating liquid or an insulating gas.

According to at least one form of embodiment, the insulating medium stands under a pressure increased relative to ambient pressure. As a result, necessary electrical spark widths can be reduced, which contributes to a more compact form of construction.

According to the improved concept, a test arrangement for carrying out high-voltage tests on a test piece is also indicated. The test arrangement comprises a choke according to the improved concept.

According to at least one form of embodiment, the housing of the choke is earthed.

According to at least one form of embodiment, the test arrangement comprises a power feed source connectible or connected with the choke and the test piece to form a resonance circuit. In that case the choke is arranged between the feed source and the test piece. In particular, the high-voltage terminal is connectible or connected with the test piece and the further voltage terminal is connectible or connected with the feed source.

According to at least one form of embodiment, the feed source is constructed as a voltage source with variable frequency.

According to at least one form of embodiment, the test arrangement comprises one or more further chokes, which are connected in series or parallel with the choke. In such forms of embodiment the further voltage terminal of the choke is connectible or connected with the feed source directly or by way of the further chokes. The further chokes or individual ones of the further chokes can be constructed in accordance with the improved concept.

According to at least one form of embodiment, the test arrangement comprises the test piece.

According to at least one form of embodiment, the resonance circuit is a series resonance circuit or a parallel resonance circuit.

The invention is explained in detail in the following by way of exemplifying forms of embodiment with reference to the drawings. Components which are functionally identical or have an identical effect can be provided with identical reference numerals. Identical components or components with an identical function are in some circumstances explained only with respect to the figure in which they first appear. The explanation is not necessarily repeated in the subsequent figures.

FIG. 1 shows a block-circuit diagram of an exemplifying form of embodiment of a test arrangement with a choke according to the improved concept, in particular a series resonance circuit.

The test arrangement comprises a feed source EQ, which is constructed as an alternating voltage source, a choke D according to the improved concept, and a test piece, which is connected in series with the choke D and has a test-piece capacitance. One or more further test chokes can optionally be connected into the resonance circuit in series and/or parallel with the choke D, the further test chokes being constructed, for example, like the choke D. In addition, the resonance circuit can comprise further components.

The feed source EQ is, for example, connected with a coil of the choke D. In operation, an excitation voltage, particularly an alternating voltage, is provided by the feed source EQ and decays across the choke D and test piece P. In the case of resonance, a test voltage decays across the test piece P, the test voltage being greater in amount than the excitation voltage so that a voltage excess arises. The quality of the resonance circuit, thus the ratio of test reactive power to loss power of the resonance circuit, corresponds with the ratio of the test voltage to the excitation voltage.

Figure 2:
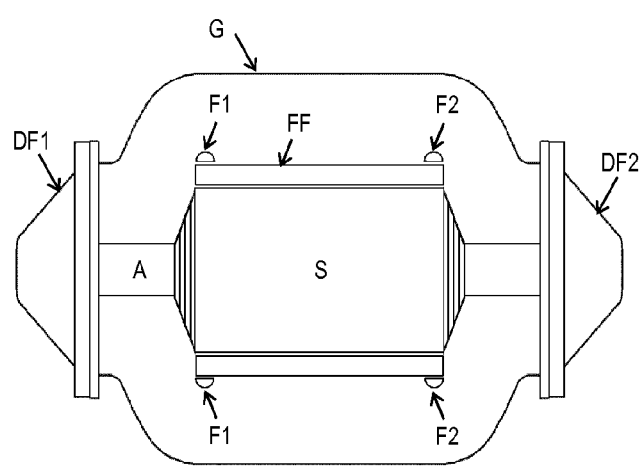
FIG. 2 shows a sectional illustration of an exemplifying form of embodiment of a choke according to the improved concept.
Figure 3:
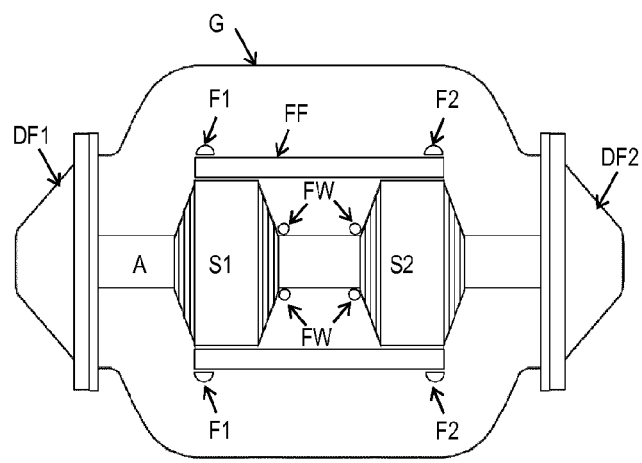
FIG. 3 shows a sectional illustration of a further exemplifying form of embodiment of a choke according to the improved concept.

Different forms of embodiment of the choke D are now described in more detail with respect to FIGS. 2 and 3.

FIG. 2 shows an exemplifying form of embodiment of a choke according the improved concept.

The choke has a housing G which consists at least in part of metal, for example of steel. In a resonance circuit, the housing is, for example, earthed. The choke comprises a central suspension A, about which a coil S is arranged. The choke additionally comprises a first lead-through DF1 and a second lead-through DF2, wherein at least the first lead-through DF1 is constructed as a high-voltage lead-through. The first lead-through DF1 serves for, for example, connection of the test piece P in an arrangement as shown in FIG. 1. The second lead-through DF2 serves for, for example, connection of the feed source EQ in an arrangement as shown in FIG. 1 or for connection of a further choke. The suspension is, for example, attached to the housing G and/or to one or both of the suspensions DF1, DF2.

The choke comprises a flux guiding device FF for guiding a magnetic flux generatable by means of the coil S. The flux guiding device FF contains or consists of ferromagnetic material. In the illustrated example the flux guiding device FF consists of a cylindrical component, which completely surrounds the coil S in radial direction, or of several, for example four, segments which partly or completely surround the coil S in radial direction.

In addition, the choke comprises, for example, two field control electrodes F1 and F2, which are each arranged at a respective face end of the cylindrical component between the flux guiding device FF and the housing G. The field control electrodes F1, F2 are, for example, of annular configuration and radially surround the cylindrical component. The field control electrodes F1, F2 serve for shielding or avoiding ultra-high field strengths between the flux guiding device FF and housing G. Without the field control electrodes, the spacings between the housing G and flux guiding device FF would have to be increased in order to reliably prevent electrical discharges.

The cylindrical component or the segments of the flux guiding device FF is or are arranged between the coil S and the field control electrodes F1, F2. Consequently, the magnetic stray fluxes through the housing G and also through the field control electrodes F1, F2 are reduced or prevented by the flux guiding device FF. Eddy currents in the housing G and the field control electrodes F1, F2 are reduced by the thus-controlled magnetic flux. It is possible through this construction to equip compact chokes with, for example, a steel housing. In addition, the field control electrodes F1, F2 can be made entirely or partly of metal; expensive production from conductively coated plastics materials is not required.

FIG. 3 shows a further exemplifying form of embodiment of a choke according to the improved concept. The form of embodiment of FIG. 3 is based on the form of embodiment of FIG. 2.

By contrast to the form of embodiment of FIG. 2 the choke of FIG. 3 comprises, instead of the coil S, two coils S1 and S2 which are connected in series and which are arranged axially adjacent to one another on the suspension A. In other words, use is made of a coil with two sub-windings S1, S2 connected in series. In alternative forms of embodiment, the two coils S1, S2 can be arranged radially one above the other.

Optionally, further field control electrodes FW are provided, these being arranged between the mutually facing ends of the coils S1, S2 in order to reduce the electrical maximum feed strength between the two coils S1, S2 and thus to be able to reduce the spacing thereof from one another, which contributes to a compact form of construction. The further field control electrodes FW are, for example, of annular configuration and radially surround the suspension A.

Eddy current losses in the choke housing as well as in electrically conductive components of the choke are reduced by a choke according to the improved concept. In particular, economic materials can be used for the housing or the electrically conductive components and a particularly compact form of construction of the choke achieved, since due to the reduced eddy current losses a higher electrical resistance of the housing or of the electrically conductive components is of lesser importance. Accordingly, chokes with greater power capacity can be constructed for the same constructional size. By virtue of the lower eddy current losses, the quality of a resonance circuit in which a choke is used is increased. The power requirement of the feed is thereby reduced. Through reduction of the power of the feed, other components integrated in the test arrangement can be reduced with respect to their power and constructional size.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE NUMERALS

D choke
P test piece
EQ feed source
G housing
A suspension
FF flux guiding device
S, S1, S2 coils
F1, F2, FW field control electrodes
DF1, DF2 lead-throughs

The invention claimed is:

1. A choke for carrying out high-voltage tests, the choke comprising:
   a housing;
   a coil arranged in an interior of the housing;
   at least one electrically conductive component arranged between the coil and the housing, the at least one electrically conductive component comprising a field control electrode; and
   a flux guide configured to guide a magnetic flux that is configured to be generated by the coil,
   wherein the flux guide:
      comprises a ferromagnetic material; and
      is arranged between the coil and the at least one electrically conductive component, comprising the field control electrode, in such a way that the magnetic flux that is configured to be generated by the coil is guided past the electrically conductive component, comprising the field control electrode.

2. The choke according to claim 1, wherein the housing consists at least in part of an electrically conductive material and the flux guide is so arranged that it screens the electrically conductive material of the housing from a magnetic flux able to be generated by means of the coil.

3. The choke according to claim 1, wherein the flux guide comprises a cylindrical component which at least partly radially surrounds the coil.

4. The choke according to claim 1, wherein the flux guide comprises at least two segments which are arranged to be distributed radially around the coil and which extend along the coil.

5. The choke according to claim 1, wherein the flux guide is electrically and mechanically connected with the coil.

6. The choke according to claim 1, wherein the electrically conductive component is arranged between the flux guide and the housing.

7. The choke according to claim 1, wherein the coil is an air coil.

8. The choke according to claim 1, wherein the choke comprises a suspension, which carries the coil, and the flux guide comprises an inner component arranged in an interior of the suspension.

9. The choke according to claim 1, wherein the flux guide comprises at least one end component which is arranged at a face end of the coil and is oriented perpendicularly to a winding axis of the coil.

10. The choke according to claim 1, wherein the choke comprises at least one further coil, which is connected in series with the coil.

11. The choke according to claim 1, wherein the choke comprises at least one high-voltage terminal for electrical contacting of the coil.

12. The choke according to claim 1, wherein the choke is a choke with fixed inductance.

13. A test arrangement for carrying out high-voltage tests on a test piece, wherein the test arrangement comprises one or more chokes connected in series or parallel, wherein at least one of the chokes is constructed in accordance with claim 1.

14. The test arrangement according to claim 13, wherein the test arrangement comprises a feed source, which is connectible with the one or more chokes and the test piece to form a resonance circuit.

15. The choke according to claim 6, wherein the electrically conductive component is arranged radially between the flux guide and the housing.

* * * * *